United States Patent
Elian et al.

(10) Patent No.: US 8,722,462 B2
(45) Date of Patent: May 13, 2014

(54) SEMICONDUCTOR PACKAGE

(75) Inventors: Klaus Elian, Alteglofsheim (DE); Beng-Keh See, Regensburg (DE); Horst Theuss, Wenzenbach (DE)

(73) Assignee: Infineon Technologies AG, Neubiberg (DE)

(*) Notice: Subject to any disclaimer, the term of this patent is extended or adjusted under 35 U.S.C. 154(b) by 445 days.

(21) Appl. No.: 12/750,917

(22) Filed: Mar. 31, 2010

(65) Prior Publication Data

US 2011/0241190 A1 Oct. 6, 2011

(51) Int. Cl.
*H01L 21/00* (2006.01)

(52) U.S. Cl.
USPC .............. 438/112; 257/676; 257/E23.031

(58) Field of Classification Search
USPC ........... 257/98, 116, 676, 678, 690, 692, 693, 257/699, 730, E21.499, E21.502, E23.031; 438/112
See application file for complete search history.

(56) References Cited

U.S. PATENT DOCUMENTS

| 7,053,456 | B2 | 5/2006 | Matsuo | |
|---|---|---|---|---|
| 7,482,194 | B2 | 1/2009 | Matsuo | |
| 7,608,177 | B2 | 10/2009 | Nauber et al. | |
| 2005/0067769 | A1* | 3/2005 | Albat et al. | 271/226 |
| 2005/0218488 | A1 | 10/2005 | Matsuo | |
| 2006/0124458 | A1 | 6/2006 | Nauber et al. | |
| 2006/0157808 | A1 | 7/2006 | Matsuo | |
| 2007/0216038 | A1* | 9/2007 | Park et al. | 257/784 |
| 2007/0235774 | A1* | 10/2007 | Zandman et al. | 257/256 |
| 2009/0039484 | A1* | 2/2009 | Mahler et al. | 257/676 |
| 2009/0293604 | A1* | 12/2009 | Sham et al. | 73/146.5 |
| 2010/0301450 | A1* | 12/2010 | Lin | 257/531 |
| 2011/0115070 | A1* | 5/2011 | Lim et al. | 257/698 |

FOREIGN PATENT DOCUMENTS

DE    10 2006 012 755 A1    9/2007

\* cited by examiner

*Primary Examiner* — Vongsavanh Sengdara

(74) *Attorney, Agent, or Firm* — Slater & Matsil, L.L.P.

(57) ABSTRACT

A method of manufacturing a semiconductor package includes providing a carrier and attaching at least one semiconductor piece to the carrier. An encapsulant is deposited onto the at least one semiconductor piece to form an encapsulated semiconductor arrangement. The encapsulated semiconductor arrangement is then singulated in at least two semiconductor packages, wherein each package includes a semiconductor die separated from the semiconductor piece during singulation.

26 Claims, 8 Drawing Sheets

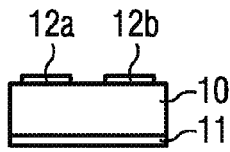
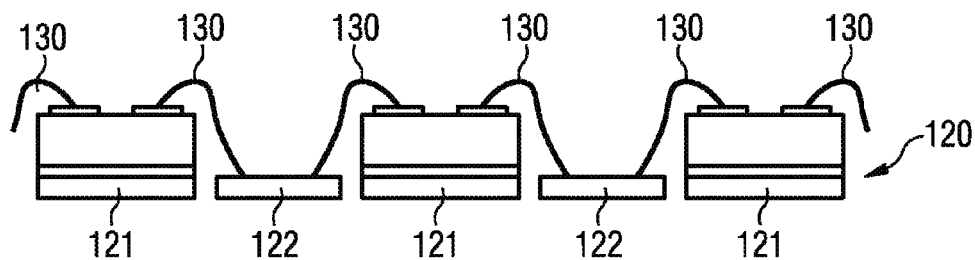
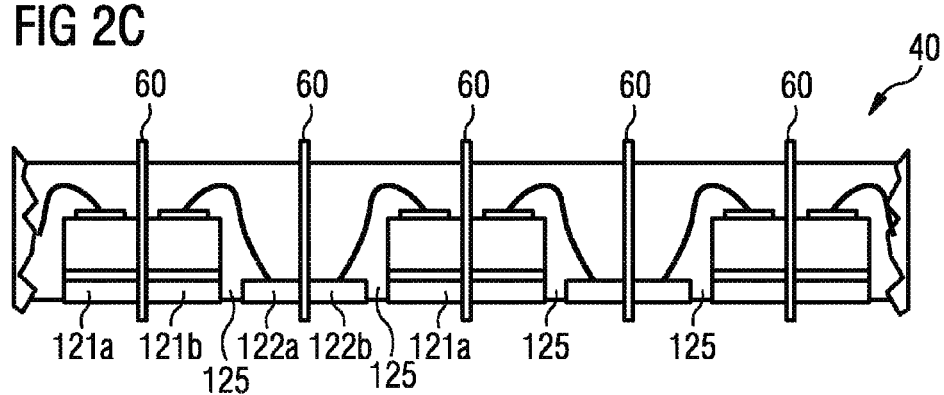
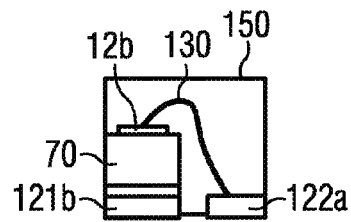
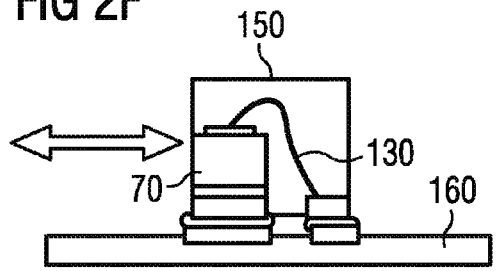
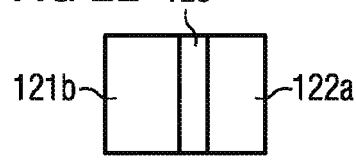

FIG 6A
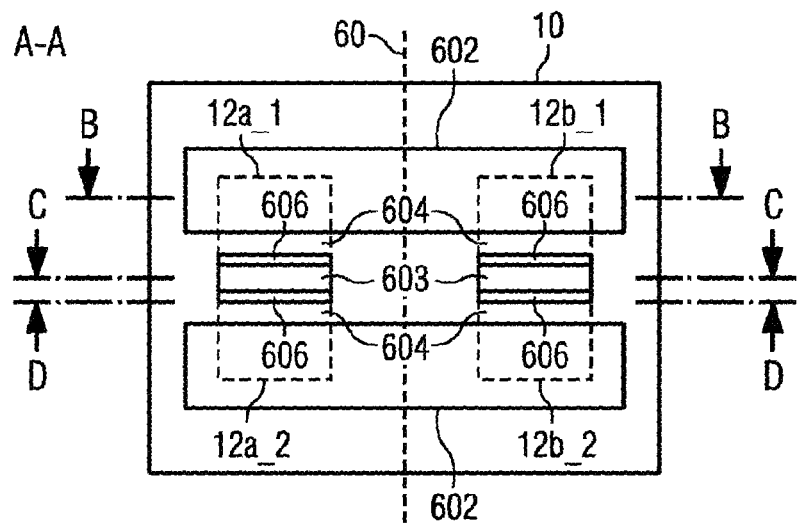
FIG 6B
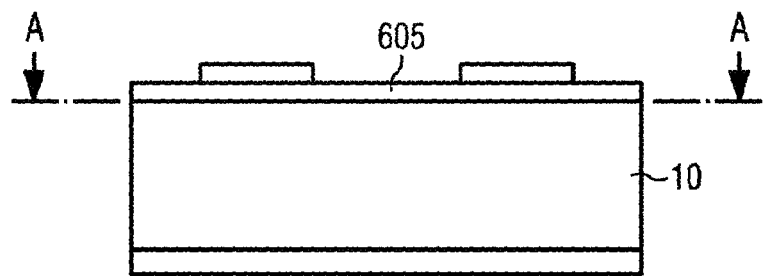
FIG 6C  B-B
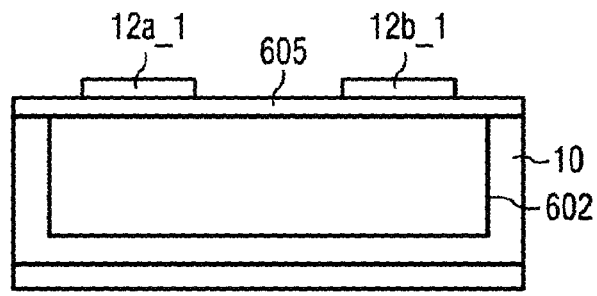

C-C

D-D

SEMICONDUCTOR PACKAGE

TECHNICAL FIELD

The invention relates generally to semiconductor packages, and more particularly to packaging of a sensor or emitter die.

BACKGROUND

Semiconductor dies are typically encapsulated in a mold compound in order to protect the dies from environmental impacts to ensure reliability and performance. If signal inlets and outlets are needed as is the case for sensor or emitter dies, packages may become large, sophisticated and expensive. However, both the manufacturers and the consumers of electronic devices desire devices that are inexpensive, reduced in size and yet have increased device functionality.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of the embodiments will be readily appreciated as they become better understood by reference to the following detailed description.

FIGS. 2A to 2F schematically illustrate one exemplary embodiment of a method of manufacturing a semiconductor package;

FIG. 6A schematically illustrates a sectional view of a semiconductor piece for manufacturing an embodiment of a semiconductor package including a pressure sensor;

FIG. 6B schematically illustrates a side view of the semiconductor package of FIG. 6A;

FIG. 6C schematically illustrates a sectional view along line B-B in FIG. 6A;

DETAILED DESCRIPTION OF ILLUSTRATIVE EMBODIMENTS

Figure 1A:
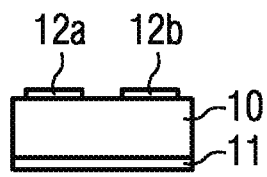
FIGS. 1A to 1D schematically illustrate one exemplary embodiment of a method of manufacturing a semiconductor package.

Aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. The following description is therefore not to be taken in a limiting sense, and the scope is defined by the appended claims. It should also be noted that the representations of the various layers, sheets, cavities or substrates in the figures are not necessarily drawn to scale.

In the following detailed description, reference is made to the accompanying drawings, which form a part thereof, and in which is shown by way of illustration specific embodiments in which the invention may be practiced. In this regard, directional terminology, such as e.g. "upper", "lower", "top", "bottom", "left-hand", "right-hand", "front side", "backside", etc., is used with reference to the orientation of the figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

The semiconductor pieces and dies (i.e., chips) described further below may be of different types, may be manufactured by different technologies and may include, for example, integrated electrical circuits, electro-optical circuits, electro-mechanical circuits such as, e.g., MEMS (Micro-Electro-Mechanical System) and/or passive devices. The semiconductor dies may, for example, be configured as sensors or emitters. By way of example, in one embodiment, the semiconductor dies may be configured as optical sensors or emitters such as, e.g., optical detectors, LEDs or laser dies. In another embodiment, the semiconductor dies may be configured as a MEMS such as, e.g., a pressure sensor. Furthermore, the semiconductor pieces and dies described herein may include control circuits, logic circuits or microprocessors. The semiconductor dies may have a vertical structure that is to say that the electric currents can flow in a direction perpendicular to the main surfaces of the semiconductor dies. A semiconductor die having a vertical structure may have contact pads, in particular, on its two main surfaces, that is to say on its front side and backside. The semiconductor pieces and dies need not be manufactured from specific semiconductor material, for example, Si, SiC, SiGe, GaAs, and, furthermore, may contain inorganic and/or organic materials that are not semiconductors, such as, for example, insulators, plastics or metals.

Furthermore the semiconductor pieces and dies described below may include electrode pads on one or more of their outer surfaces wherein the electrode pads serve for electrically contacting the semiconductor dies. The electrode pads may have the form of lands, i.e., flat contact layers on an outer surface of the semiconductor piece or die. The metal layer(s) of which the electrode pads are made may be manufactured with any desired material composition. The metal layer(s)

may, for example, be in the form of a layer covering an area. Any desired metal or metal alloy, for example, aluminum, titanium, gold, silver, copper, palladium, platinum, nickel, chromium or nickel vanadium, may be used as the material. The metal layer(s) need not be homogenous or manufactured from just one material, that is to say various compositions and concentrations of the materials contained in the metal layer(s) are possible. The electrode pads may be situated on the active main surfaces of the semiconductor dies or on other surfaces of the semiconductor dies.

Semiconductor pieces are attached to a carrier. In one embodiment, the carrier may be a leadframe, i.e., a structured metal sheet. In another embodiment, the carrier may be made of a metal sheet or plate which may be flat and unstructured. In another embodiment, the carrier may be made of a plurality of layers, wherein the upper surface layer of the carrier may be a continuous, unstructured or structured metal coating and one or more of the other layers may form a rigid structure made of a base material such as plastics, ceramics etc.

A dielectric material is provided over the carrier and the semiconductor pieces to form an encapsulant. The encapsulant may be made of any appropriate duroplastic, thermoplastic or thermosetting material or laminate (prepreg). In particular, a material based on epoxy resin may be used. The dielectric material which forms the encapsulant may contain a filler material. After its deposition, the dielectric material may be hardened by a heat treatment. Various techniques may be employed to form the encapsulant by the dielectric material, for example, compression molding, transfer molding, injection molding, powder molding, liquid molding, dispensing or laminating.

The encapsulant and the semiconductor piece(s) embedded in the encapsulant are diced simultaneously to form multiple packages, wherein each package includes at least one die cut from the semiconductor piece. Thus, package separation and semiconductor dicing are performed simultaneously. Singulation may be accomplished by any dicing technique such as e.g., mechanical dicing (e.g., water jet dicing, by blade dicing (sawing)), chemical dicing (e.g., etching) or by laser dicing. Package-and-die dicing may be accomplished by one single dicing method or by a combination of different dicing methods. By way of example, in one embodiment, blade dicing may be used as a single method for singulation. According to another embodiment, chemical dicing (etching) may be used to dice the encapsulant and a stealth dicing process may be employed to dice the semiconductor pieces. Many other combinations of dicing techniques are feasible.

FIGS. 1A to 1D schematically illustrate a method for manufacturing a semiconductor package. Firstly, a semiconductor piece 10 is provided. The semiconductor piece 10 may be made of any semiconductor material such as, e.g., Si, SiC, Ge or compound semiconductors such as, e.g., GaAs, GaAlAs, GaP, GaAsP, CdTe, CdSe, CdS, ZnS, ZnSe, ZnTe, etc. Typically, the semiconductor piece 10 has been diced from a semiconductor wafer. As will be described in more detail further below, the semiconductor piece 10 includes a plurality of functional dies to be singulated and packaged.

The semiconductor piece 10 may be provided with a plurality of electrode pads 11, 12a, 12b. By way of example, the semiconductor piece 10 may be provided with a first electrode pad 11 located at the bottom side of the semiconductor piece 10 and with a plurality of second electrode pads 12a, 12b located at the top side of the semiconductor piece 10. The functional dies included in the semiconductor piece 10 may have a vertical structure allowing a current flow between the first 11 and second 12a, 12b electrode pads. Alternatively, all electrode pads may be located at one of the main surfaces of the semiconductor piece 10. By way of example, all electrode pads may be located at the top side of the semiconductor piece 10 (and are thus represented by electrode pads 12a, 12b in FIG. 1A) and a metal layer 11 allowing for efficient heat removal but having no electrical function may be provided as layer 11.

Figure 1B:
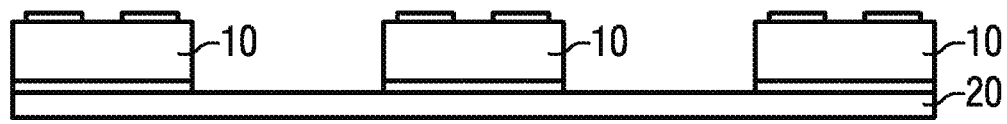

As shown in FIG. 1B, semiconductor pieces 10 are placed on a carrier 20. The semiconductor pieces 10 may be placed in a sequential one-by-one placement process known as pick-and-place in the art. It is also possible to use a high-throughput parallel die placement method.

The semiconductor pieces 10 may be placed face-up or face-down on the upper surface of the carrier 20. Face-up placement refers to a semiconductor piece 10 orientation in which the active surfaces of the functional dies integral with the semiconductor piece 10 face away from the carrier 20. Face-down placement refers to a semiconductor piece 10 orientation in which the active surfaces of the functional dies integral with the semiconductor piece 10 faces the carrier 20.

The carrier 20 may be of various types. In one embodiment the carrier may be a patterned metal sheet or plate, e.g., a leadframe. The carrier 20 may include metal plate regions that are separated from each other by spacing, as will be explained later in more detail. In another embodiment the carrier 20 may be a continuous, unpatterned metal plate or sheet. In still another embodiment the carrier 20 may be a PCB (Printed Circuit Board) or a rigid plastic sheet-like element coated with a patterned or unpatterned metal coating.

Figure 1C:
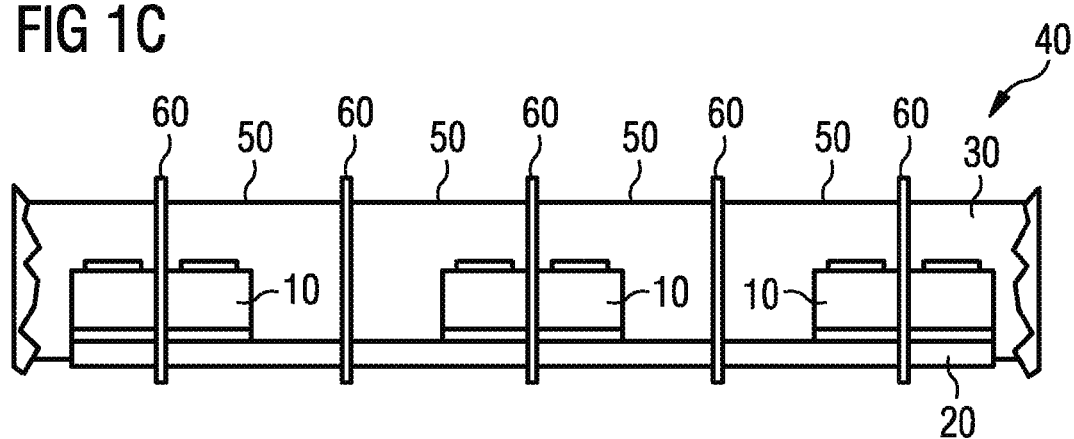

An electrically insulating molding material 30 may then be applied to the semiconductor pieces 10 and the carrier 20, see FIG. 1C. The molding material 30 may be used to completely encapsulate the semiconductor pieces 10 except their bottom surfaces which are covered by the carrier 20. The molding material 30 may be an epoxy-based dielectric or another appropriate dielectric or insulating material used in contemporary semiconductor packaging technology. It may also be a photoresist such as SU8, which is epoxy-based. The molding material 30 may be composed of any appropriate thermoplastic or thermosetting material. After curing, the molding material 30 provides stability to the array of semiconductor pieces 10 mounted on the carrier 20.

Various techniques may be employed to cover the semiconductor pieces 10 with the molding material 30. For example, compression molding may be used. In compression molding, a liquid molding material 30 is dispensed into an open lower mold half of which the carrier 20 forms the bottom. Then, after dispensing the liquid molding material 30, an upper mold half is moved down and spreads out the liquid molding material until a cavity between the carrier 20 arranged at the bottom of the lower mold half and the upper mold half is completely filled. This process may be accompanied by the application of heat and pressure.

In another embodiment the molding material 30 may be applied by an injection molding process. Injection molding includes the injection of liquid molding material into a closed molding tool accompanied by the application of heat and pressure.

After curing the molding material 30 (encapsulant) is rigid and forms a molded body 40. The molded body 40 is also referred to as an encapsulated semiconductor arrangement.

Still referring to FIG. 1C, the molded body 30 may be cut into a plurality of semiconductor packages 50. Cutting lines 60, which are also referred to as dicing streets, are shown in FIG. 1C.

The cutting lines 60 both intersect molding material (encapsulant) 30 and semiconductor material of the semiconductor pieces 10. In other words, separation into packages 50 simultaneously separates the molded body (encapsulated semiconductor arrangement) 40 into separate packages 50 and one or more semiconductor pieces 10 into dies 70. Further, during separation, the carrier 20 is separated into package carriers 80.

Figure 1D:
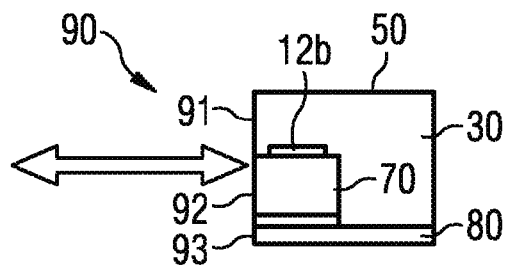

FIG. 1D shows an exemplary embodiment of a semiconductor package 50 including a die 70 and a package carrier 80. As a result of the "global" dicing approach, one side wall 90 of the semiconductor package 50 includes a surface area 91 made of encapsulant 30, a surface area 92 made of semiconductor material and (optionally) a surface area 93 made of the material of the carrier 20. The surface areas 91, 92 and 93 are all faces formed by the cutting process. Thus, the surface areas 91, 92, 93 may be flush with each other.

Singulating the molded body (encapsulated semiconductor arrangement) 40 into separate semiconductor packages 50 may be accomplished by various techniques. Mechanical singulation can be performed by blade dicing (sawing). In other embodiments, techniques such as laser dicing, etching or water jet separation may be used. All these techniques may be combined. For instance, laser dicing and, in particular, stealth dicing may be used to separate the semiconductor pieces 10 into dies 70. Laser dicing and, in particular, stealth dicing is known to allow for minimum material loss and high quality of the cleaved die surface area 92. On the other hand, other techniques could be used for dicing the encapsulant 30. Irrespective of which technique or combination of techniques is used, package 50 and die 70 separation is performed "simultaneously", i.e., essentially at the same stage or occasion in the manufacturing process. In particular, package 50 and die 70 separation may be performed by the same cutting process at the same instant of time.

Singulating the molded body (encapsulated semiconductor arrangement) 40 along cutting lines 60 may be performed simultaneously in a parallel process or may be performed sequentially. In the latter case, for instance, one package 50 after the other may be cut away from the molded body 40. To this end, the molded body 40 may, e.g., have the form of a bar and may be moved package-by-package through a cutting zone in a cutting machine.

Package 50 is configured to embed a die 70 which may be an edge emitter or edge sensor. In other words, die 70 includes an active area which has been intersected by the cutting process and may thus be, e.g., directly (i.e., without protection) exposed to the environment. For instance, die 70 may be an optical edge emitter, e.g., a LED or laser. In another embodiment die 70 may be an optical sensor having a light sensitive active area exposed to the environment at the exposed surface area 92. Other types of sensors include pressure sensors and will be discussed in greater detail further below.

Generally spoken, the die 70 includes a signal input or signal output which is exposed to the environment at the exposed semiconductor surface area 92. Among others, input and/or output signals may be electromagnetic radiation (light) or pressure such as, e.g., static pressure or sound waves. In FIG. 1D, the input and/or output signal of die 70 received and/or emitted at exposed surface 92 is indicated by an arrow.

It is to be noted that side wall surfaces other than the exposed surface area 92 of the semiconductor die 70 may be partly or completely covered by encapsulant 30. Further, the top surface of the die 70 may be completely covered with encapsulant. Thus, all faces of the semiconductor die 70 may be completely embedded in the package 50, that is covered by encapsulant 30 or the package carrier 80, except the exposed surface area 92. Such package design provides high resistance against moisture, chemical substances, corrosion of die electrode pads 12a, 12b and other metallizations or bonding elements and thus ensures reliability.

FIGS. 2A to 2F illustrate one embodiment of a method of manufacturing a semiconductor package 150. The method shown in FIGS. 2A to 2F is an implementation of the method shown in FIGS. 1A to 1D. The details of the method that are described below can therefore be likewise applied to the method of FIGS. 1A to 1D, and vice versa.

Figure 3A:
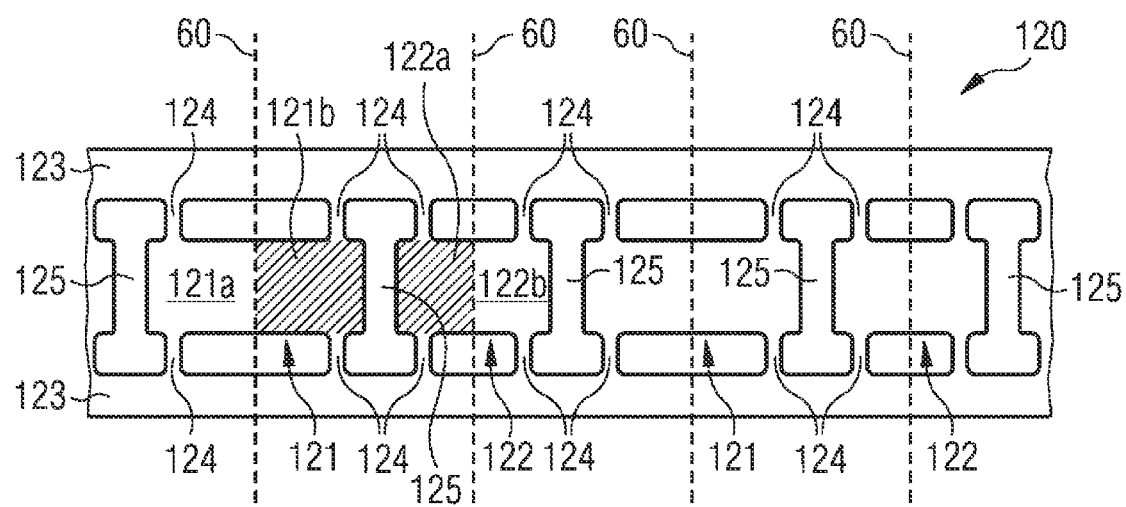
FIG. 3A schematically illustrates a plan view of a carrier used in several embodiments.

In FIG. 2A, a semiconductor piece 10 corresponding to the semiconductor piece 10 of FIG. 1A is shown. Semiconductor pieces 10 are then placed on a carrier 120, of which a side elevation view is shown in FIG. 2B and a plan view is shown in FIG. 3A. Carrier 120 is a sheet-like patterned metal band provided with a regular structure, also referred to as leadframe in the art. More specifically, first and second metal sections 121 and 122 are connected to a frame 123 via bridges 124 and are arranged in an alternate order along the longitudinal extension of the carrier 120. The first and second sections 121, 122 are separated by spacings 125. The carrier 120 may be produced by a stamping or milling process.

The semiconductor pieces 10 are placed and mounted on the first sections 121. Any appropriate mounting techniques such as soldering, gluing, using a conductive adhesive, etc., may be used.

In a subsequent step still shown in FIG. 2B, the electrode pads 12a, 12b of the semiconductor pieces 10 are electrically bonded to the second sections 122 of the carrier 120. By way of example, wire bonding techniques may be used. Other bonding techniques include ribbon bonding, tape bonding, wedge bonding etc. Bonding results in that the first electrode pad 12a of a semiconductor piece 10 is electrically connected to the same second section 122 of the carrier 120 as the second electrode pad 12b of another semiconductor piece 10 adjacent to the first-mentioned semiconductor piece 10.

According to FIG. 2C and in accordance to the description in conjunction with FIG. 1C, a molded body 40 is then produced. The molded body 40 encapsulates the semiconductor pieces 10, the wire bonds 130 and fills the spacings 125 between the first 121 and second 122 sections of the carrier 120.

Still referring to FIG. 2C, the molded body (encapsulated semiconductor arrangement) 40 is singulated in separate packages 150 along cutting lines 60. In this context, reference is made to the description in conjunction with FIG. 1C in order to avoid reiteration.

FIG. 3A illustrates that the cutting lines 60 intersect in alternate order first and second 122 sections of the carrier 120. More specifically, the first section 121 is divided into a left-hand first sub-section 121a and a right-hand first sub-section 121b. Likewise, the second sub-section 122 is divided into a left-hand second sub-section 122a and a right-hand second sub-section 122b.

Each of the left-hand and right-hand first sub-sections 121b, 121b forms a die-bonding package carrier (corresponding to package carrier 80 in FIG. 1D) after singulation. Further, each of the left-hand and right-hand second sub-sections 122a, 122b forms a wire-bonding post after singulation. The die-bonding package carriers 121a, 121b and the wire-bonding posts 122a, 122b form electrical package terminals for connecting the semiconductor package 150 to external circuits or applications. A side elevation view similar to FIG. 1D and a bottom view (footprint) of semiconductor package 150 are shown in FIGS. 2D and 2E, respectively.

Figure 3B:
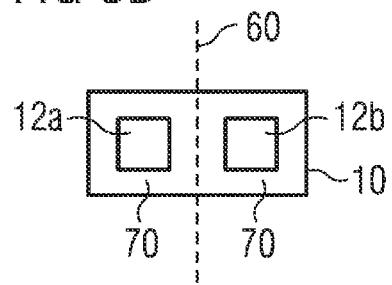
FIG. 3B schematically illustrates a plan view of a semiconductor piece used in several embodiments.

FIG. 3B is a top plan view of the semiconductor piece 10 illustrating that the cutting line 60 may extend in between of the first and second electrode pads 12a, 12b to divide the semiconductor piece 10 into two semiconductor dies 70 of, e.g., the same size. In other words, the two functional dies included in the semiconductor piece 10 are singulated into two (real) dies by the package-and-die dicing step. Throughout the specification, when referring to dies of the (intact) semiconductor piece 10, functional dies (that is not individualized, real dies 70) are meant.

The semiconductor package 150 may for instance be mounted on a (customer's) board 160 as shown in FIG. 2F. All known assembly techniques such as, e.g., soldering, gluing using an conductive adhesive etc. may be used. Again, the arrow indicates emission or reception of a signal, e.g., a light or pressure (sound) signal, which may be received or emitted by another component (not shown). The other component can be of similar type and can likewise be mounted on the board 160.

Figure 4A:
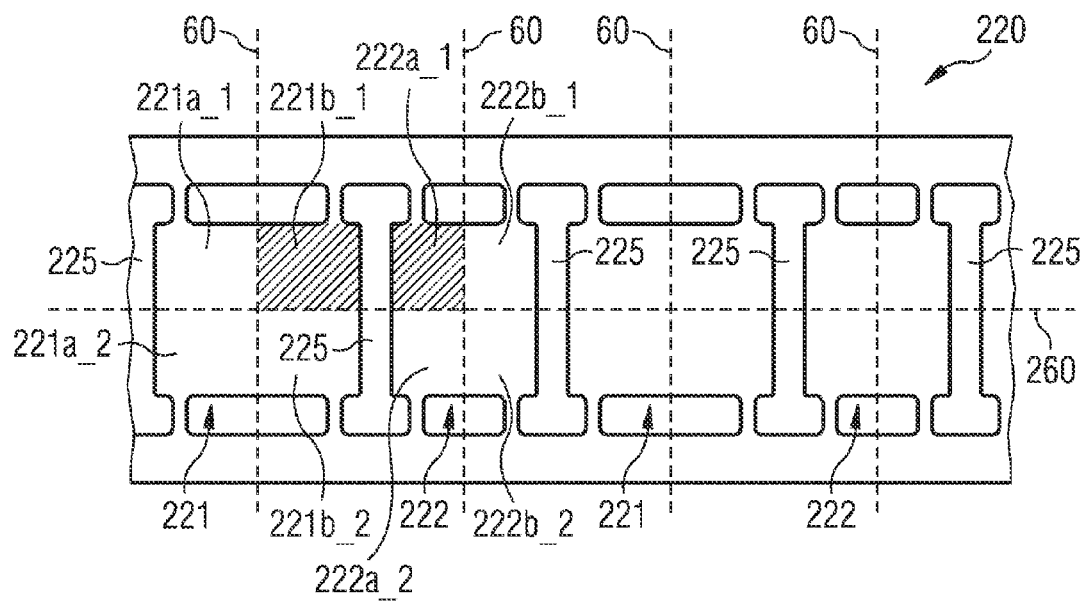
FIG. 4A schematically illustrates a plan view of a carrier used in several embodiments.
Figure 4B:
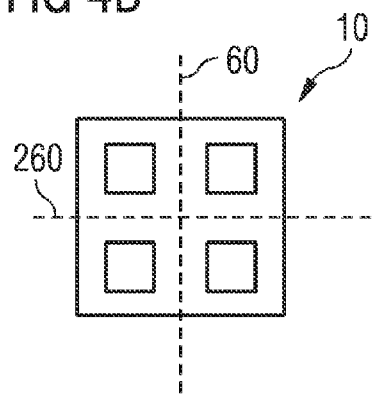
FIG. 4B schematically illustrates a plan view of a semiconductor piece used in several embodiments.

FIG. 4A is a plan view of a carrier 220 according to one embodiment. The carrier 220 may be made of the same material as carrier 120, and is also referred to as a leadframe. Further, carrier 220 is patterned similar to carrier 120, with first 221 and second 222 sections arranged in alternate order and spaced apart by spacings 225. As a difference to carrier 120, carrier 220 is configured to be provided with semiconductor pieces 10 containing four functional dies (FIG. 4B). Package-and-die dicing is performed along the cutting line 60 and additional along cutting line 260, which extends in a perpendicular direction to cutting line 60. As a consequence, each semiconductor piece 10 is singulated into four dies 70, each first section 221 is divided into four first sub-sections 221a_1, 221b_1, 221b_2, 221a_2 and each second section 222 is divided into four second sub-sections 222a_1, 222b_1, 222b_2, 222a_2.

When using carrier 220, packages produced according to the method shown in FIGS. 4A and 4B are very similar to packages 150 shown in FIGS. 2D, 2E and 2F. However, as apparent from FIG. 4B, packages produced according to the method illustrated in FIGS. 4A and 4B have two side walls at which the die 70 is exposed to the environment.

It is to be noted that in other embodiments carriers of different pattern than carriers 120, 220 may be used and semiconductor pieces 10 including more than four functional dies may be employed.

Figure 5A:
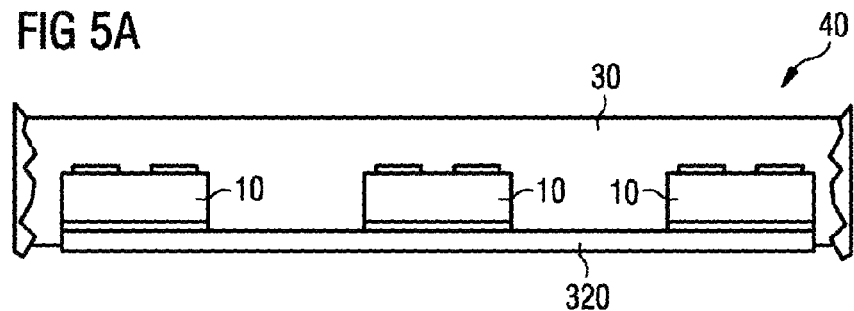
FIGS. 5A to 5D schematically illustrate one exemplary embodiment of a method of manufacturing a semiconductor package.
Figure 5B:
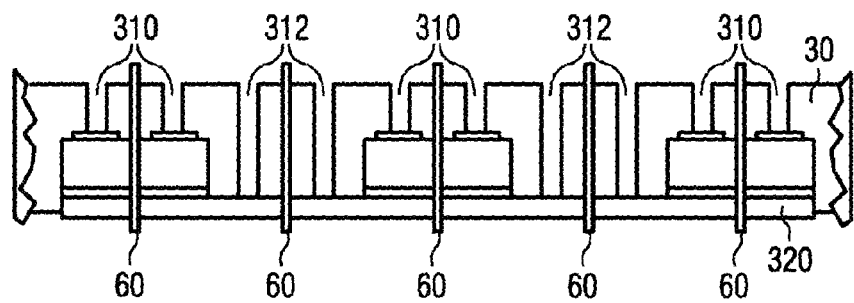
Figure 5C:
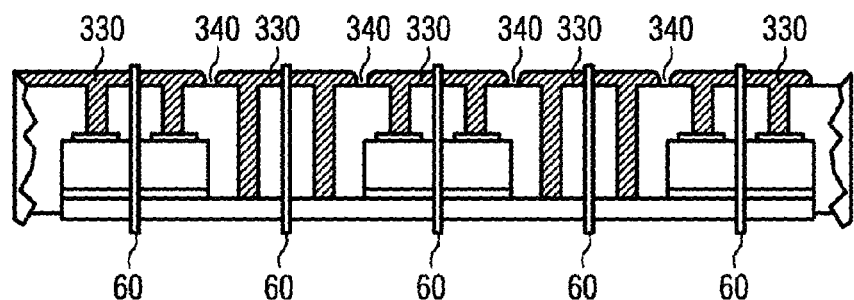

FIGS. 5A to 5C schematically illustrate a method for manufacturing a semiconductor package according to one embodiment. First steps of this method are similar to the steps shown in FIGS. 1A and 1B, and in order to avoid reiteration, reference is made to the description above.

FIG. 5A is a sectional view of the molded body 40 similar to FIG. 1C. However, the cutting lines 60 are not yet depicted. Similar to carrier 20, the carrier 320 may be an unpatterned, continuous carrier made of, e.g., a metal plate or sheet or of a multi-layer substrate such as e.g. a PCB.

The molding material (encapsulant) 30 may be structured as illustrated in FIG. 5B. A plurality of first 310 and second 312 recesses (or cutouts or through-holes or trenches) are created in the molding material 30. First recesses 310 are arranged to expose at least portions of the second electrode pads 12a, 12b of the semiconductor piece 10. Second recesses 312 are arranged to expose at least portions of the upper surface of the carrier 320. Removing the molding material 30 may be carried out by using a laser beam or a water-jet, mechanical sawing using a saw or a cutter, chemical etching, milling or any other appropriate method. If the molding material 30 includes photo-active components, the molding material 30 may also be photolithographically structured. The width of the first 310 and second 312 recesses may, for example, be in the range from 20 to 500 μm.

As illustrated in FIG. 5C, the first and second recesses 310, 312 may then be filled with conducting material 330. More specifically, a paste containing metal particles may be deposited in the first 310 and second 312 recesses and on the top planar surface of the molding material 30 as illustrated in FIG. 5C. The metal particles may, for example, be made of copper, silver, gold, tin or nickel or a metal alloy. According to one embodiment, the metal particles may be made of a pure metal.

The application of the conducting paste containing the metal particles may be performed by stencil printing, screen printing, ink-jet printing or other suitable printing technologies. Moreover, the conducting paste may be distributed by a squeegee. Other techniques for the application of the conducting paste are also possible, for example, dispensing or spin-coating. Further, the conducting material 330 may be applied by any other technique, e.g., galvanic or electroless plating, PVD (Physical Vapor Deposition), CVD (Chemical Vapor Deposition), etc.

The conducting material 330 on the upper surface of the molding material (encapsulant) 30 is structured or patterned by gaps 340 preventing conducting material 330 applied to the first recesses 310 to be in electrical contact with conducting material 330 applied to the second recesses 312. Depending on the technique used for the application of the conducting material 330, these gaps 340 may be generated during the (structured) application of the conducting material 330 or may be generated at a later stage of the manufacturing process after the application of the molding material 330 by a subsequent structuring process. Subsequent structuring processes may, for instance, include photolithographically patterning and etching Singulating the molded body (encapsulated semiconductor arrangement) 40 may be accomplished either before (FIG. 5B) or after the application of the conducting material 330. All aforementioned techniques may be used and reference is made to the foregoing description for the sake of brevity. Without saying, the semiconductor pieces 10 may be of different sizes, may contain different numbers of functional dies and cutting lines 60, 260 may be oriented in one or several directions. The molded body 40 may have the shape of a one-dimensional array as basically shown in FIGS. 3A and 4A or may have the shape of a true two-dimensional array with semiconductor pieces 10 which are placed next to each other in both lateral directions.

Figure 5D:
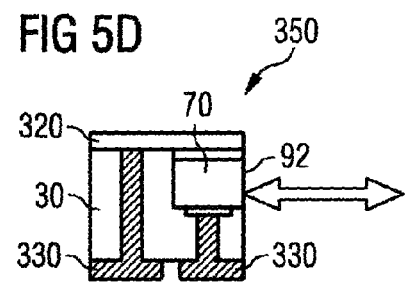

FIG. 5D illustrates a semiconductor package 350 generated according to the method described in conjunction with FIGS. 5A to 5C. The package 350 is similar to packages 50 and 150 in that at least one side wall 92 of the die 70 is exposed to the environment. Package 350 may be mounted in flip-chip (i.e., flip-die) orientation as shown in FIG. 5D, on a board (not shown), using the structured lands of the conducting material 330, on the upper surface of the molded body 40 as external package terminals to be mounted to the board.

Figure 6D:
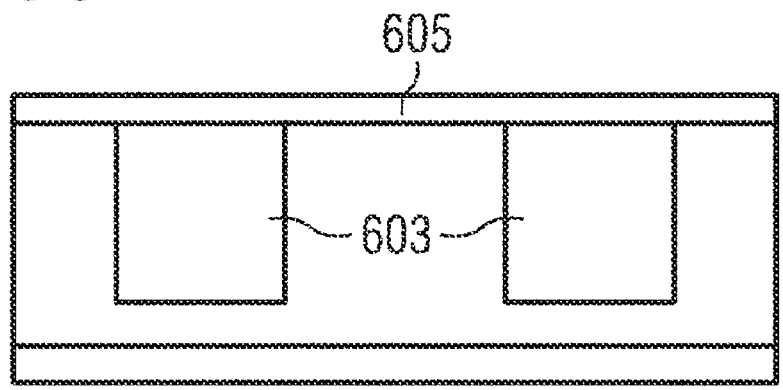
FIG. 6D schematically illustrates a sectional view along line C-C in FIG. 6A.
Figure 6E:
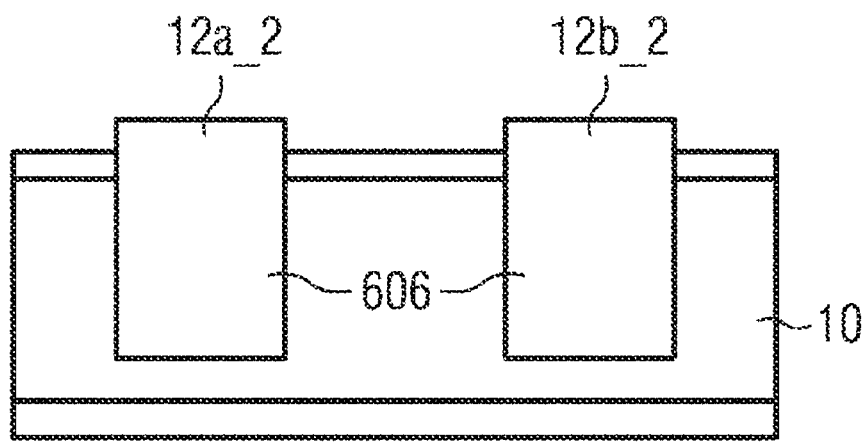
FIG. 6E schematically illustrates a sectional view along line D-D in FIG. 6A.

FIGS. 6A to 6E are illustrations of a semiconductor piece 10 for manufacturing an embodiment of a semiconductor package comprising a pressure sensor. FIG. 6A is a sectional view along line A-A of FIG. 6B. According to one embodiment, at least one first cavity 602 is created in the semiconductor piece 10. As becomes apparent from the cross-sectional view along line B-B of the semiconductor piece 10 illustrated in FIG. 6C, the first cavity 602 may extend vertically, that is in a vertical direction with respect to the top surface of the semiconductor piece 10. Further, the first cavity 602 extends in a horizontal direction from one side wall of the semiconductor piece 10 to the opposite side wall of the semiconductor piece 10. As it becomes apparent from FIGS. 6A and 6C, the first cavity 602 is manufactured to form a slit-like recess trench in the semiconductor piece 10, i.e., the first cavity 602 is enclosed by semiconductor material of the semiconductor piece 10 at the bottom and the side wall regions of the semiconductor piece 10. Further, by way of example, two (as shown, e.g., in FIG. 6A) or generally a number of first cavities 602 may be created, which may substantially run parallel to each other and may have the same shape. The two or more first cavities 602 may be spaced apart by an intermediate region of the semiconductor piece 10 lying in between adjacent first cavities 602.

In this intermediate region, second cavities 603 are created. The second cavities 603 also extend vertically inside the semiconductor piece 10, see FIG. 6D illustrating a sectional view along line C-C in FIG. 6A intersecting the second cavities 603. The second cavities 603 extend in a horizontal direction parallel to the first cavities 602. However, in the horizontal direction, as shown in FIGS. 6A and 6D, the second cavities 603 are spaced apart from each other by a central region of the semiconductor piece 10. Further, the second cavities 603 are spaced apart from the first cavities 602 by thin lamellas 604 made of the semiconductor material of the semiconductor piece 10. In other words, the second cavities 603 neither communicate to each other because of the central region of the semiconductor piece 10 nor communicate to the first cavities 602 because of the lamellas 604.

The first and second cavities 602 and 603 are closed at the top surface of the semiconductor piece 10 by a cover layer 605. The cover layer 605 may be a hard passivation layer such as, e.g., an oxide or nitride layer. Alternatively, the cover layer 605 may be made of a plastic material, e.g., of the molding material 30 during the encapsulation process.

If the cover layer 605 is made of an dielectric material (e.g., oxide or nitride), all previously described steps can be accomplished using standard semiconductor processing techniques (e.g., CMOS). Therefore, the first and second cavities 602, 603, the lamellas 604 in between the first and second cavities 602, 603 and the cover layer 605 may be produced on the wafer level, that is before the semiconductor pieces 10 are cut out from a wafer.

In one embodiment, the walls of the second cavities 603 defined by lamellas 604 may be coated with a conducting material 606. The conducting material 606 is electrically connected to electrode pads 12a_1, 12a_2 (left-hand second cavity 603) and 12b_1, 12b_2 (right-hand second cavity 603), respectively, see FIG. 6E. In other words, the lamellas 604 defined by the first 602 and second 603 cavities are configured to provide a capacitance which may be measured at the electrode pads 12a_1, 12a_2 and 12b_1, 12b_2, respectively. The positions of the electrode pads 12a_1, 12a_2 and 12b_1, 12b_2 are indicated in FIG. 6A by dashed lines.

It is to be noted that the electrodes of the capacitances may be implemented in different ways. By way of example, the semiconductor lamellas 604 may be directly connected to the electrode pads 12a_1, 12a_2 and 12b_1, 12b_2 without using a conducting material 606. In this case, in order to provide the capacitances, a p/n border may be created close to the bottom of the second cavities 603, such as to avoid current flow through the substrate. To this end, a deep p-implant may be performed followed by a lower energy n-implant, or vice versa.

In further embodiments, the semiconductor lamellas 604 may be connected to an internal read-out circuitry through internal structures created in the course of the processing of the semiconductor substrate on the wafer level. In this case, the second electrode pads 12a_1, 12a_2 and 12b_1, 12b_2 (or other electrode pads) are coupled to the read-out circuitry rather than directly to the lamellas 604 or the conducting material 606.

According to further embodiments, other elements sensitive to the deflection of the lamellas 604 may be generated on wafer level in the semiconductor pieces 10. For instance, piezo-resistors, stress sensitive transistors or the like may also be used to sense a deflection of the lamellas 604.

According to the description above, semiconductor pieces 10 as described in conjunction with FIGS. 6A to 6E are then encapsulated into a molding material 30 as previously described. The molded body 40 is then diced along cutting lines 60 as, e.g., shown in FIGS. 1C, 2C, 5B, 5C. Simultaneous package-and-die dicing along cutting line 60 results in opening or venting the first cavities 602, whereas the second cavities 603 remain hermetically sealed. The first cavities 602 are opened at exposed surface areas 92 of the two (or more) dies 70 produced from semiconductor piece 10.

As the first cavities 602 are vented, the environmental pressure is allowed to enter the first cavities 602. As the second cavities 603 are closed, a reference pressure is maintained inside the second cavity 603. The altering pressure in the vented first cavity 602 causes a deflection of the lamellas 604. The deflection of the lamellas 604 may be measured and a pressure value may be derived from this measurement of the deflection. As described by way of example in conjunction with FIGS. 6A to 6E, a capacitance between two lamellas 604 opposing each other may be used as a measure for the deflection of the opposing lamella 604 and thus for the external pressure.

Figure 7A:
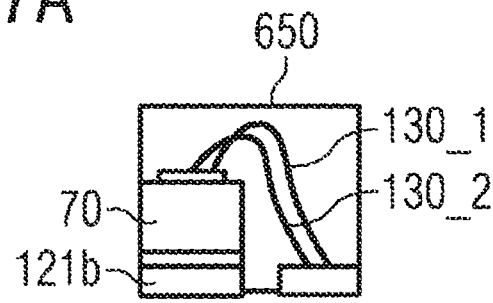
FIGS. 7A to 7C schematically illustrate one exemplary embodiment of a semiconductor package including a pressure sensor.
Figure 7B:
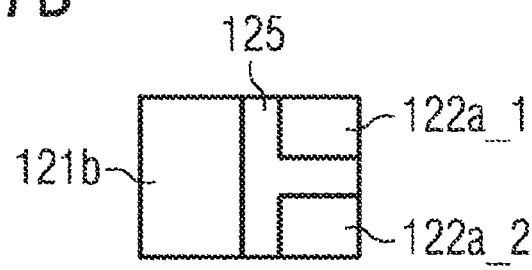
Figure 7C:
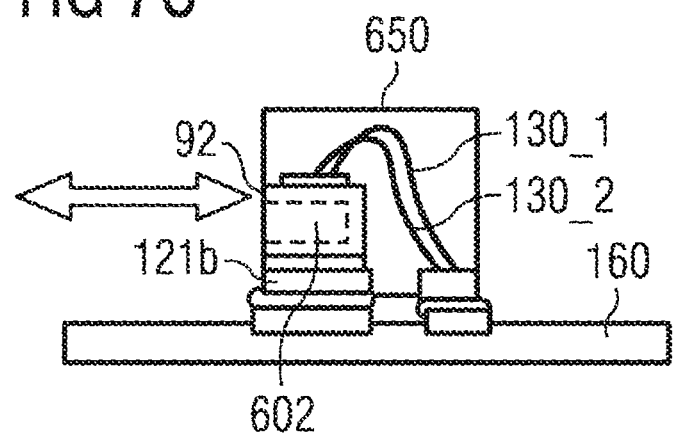

FIGS. 7A to 7C illustrate one exemplary embodiment of a semiconductor package 650 including a pressure sensor. The pressure sensor may, e.g., be manufactured according to the description of FIGS. 6A to 6E.

The semiconductor package 650 is similar to the semiconductor package 150 shown in FIGS. 2D, 2E and 2F. However, as two second electrode pads 12a are provided, two wires 130_1, 130_2 are used to connect electrode pads 12a to two second sections 122a_1, 122a_2, respectively, of the carrier. A first section 121 of the carrier provides a mounting area for dies 70. The spacing 125 between the right-hand first subsection 121b and the second sub-sections 122a_1, 122a_2 additionally extends between the two second sections 122a_1 and 122a_2. Further, in order to avoid reiteration, reference is made to the description of embodiments above.

Generally, semiconductor packages described herein can have a wide variety of shapes, sizes and terminals. It can be a single-die package or a multi-die package, whereby at least one of the dies has an exposed side wall 92.

Semiconductor packages described herein are available at low cost because of the high number of batch processes involved in manufacturing. Further, they may have high heat removal capabilities because the device carrier 80, 121b, 221b_1, 320 may provide both electrical connection to an external circuit and/or may have high thermal conductivities and may thus effectively serve as heat sink for dissipating the heat generated by the semiconductor dies 70.

Further, it is to be noted that the manufacturing methods described herein merely provide examples. Numerous other embodiments are contemplated. Generally, the semiconductor packages 50, 150, 350, 650 and other semiconductor devices not described in detail herein can be manufactured individually from an encapsulated semiconductor piece 10 or as a batch from a molded body 40 including a plurality of semiconductor pieces 10. For instance, during batch manufacturing, a group of semiconductor pieces 10 may be simultaneously placed on and mounted to the carrier 120, the second electrode pads 12*a*, 12*b* of semiconductor pieces 10 may be simultaneously bonded to external package terminals, and the encapsulant 30 for multiple packages may be simultaneously formed, if desired.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor package, the method comprising:
    attaching a semiconductor piece to a carrier, the semiconductor piece comprising a signal input/output area;
    forming an encapsulated semiconductor arrangement by depositing an encapsulant onto the semiconductor piece; and
    cutting the encapsulated semiconductor arrangement through the signal input/output area such that each of at least two semiconductor packages comprises a sidewall including a portion of the signal input output area.

2. The method of claim 1, wherein each semiconductor package comprises a semiconductor die, and wherein the semiconductor comprises the sidewall that is not covered with the encapsulant.

3. The method of claim 2, wherein after cutting, wherein all other sidewalls are completely covered with the encapsulant.

4. The method of claim 2, wherein the semiconductor die comprises an optical edge emitter or an optical edge sensor.

5. The method of claim 2, wherein the semiconductor die comprises a pressure sensor.

6. The method of claim 1, further comprising:
    electrically connecting a first electrode pad of the semiconductor piece to a first section of the carrier before depositing the encapsulant.

7. The method of claim 6, further comprising:
    electrically connecting a second electrode pad of the semiconductor piece to a second section of the carrier before depositing the encapsulant.

8. The method of claim 7, wherein the second section of the carrier is separated into at least two sub-sections when cutting the encapsulated semiconductor arrangement.

9. The method of claim 7, wherein electrically connecting the second electrode pad to the second section of the carrier comprises wire bonding, ribbon bonding or wedge bonding.

10. The method of claim 6, wherein the first section of the carrier is separated into at least two sub-sections when cutting the encapsulated semiconductor arrangement.

11. The method of claim 6, wherein electrically connecting the first electrode pad to the first section of the carrier comprises soldering.

12. The method of claim 1, wherein the carrier comprises a leadframe.

13. A method of manufacturing a semiconductor package, the method comprising:
    attaching a semiconductor piece to a carrier, the semiconductor piece comprising multiple semiconductor dies and a sensor or emitter area;
    forming an encapsulated semiconductor arrangement by depositing an encapsulant onto the semiconductor piece; and
    cutting the encapsulated semiconductor arrangement through the sensor or emitter area forming at least two separate semiconductor packages, each semiconductor package comprising a die having an exposed sensor or emitter on a first sidewall.

14. The method of claim 13, wherein the exposed sensor or emitter comprises an optical edge emitter, an optical edge sensor or a pressure sensor.

15. The method of claim 13, further comprising forming a first opening in the encapsulated semiconductor arrangement thereby exposing a first electrode pad of the semiconductor piece and forming a second opening in the encapsulated semiconductor arrangement thereby exposing an upper portion of the carrier.

16. The method of claim 15, further comprising disposing a conductive paste over the encapsulated semiconductor arrangement thereby filling the first opening and the second opening.

17. The method of claim 16, further comprising structuring the conductive paste so that a first portion of the conductive paste in the first opening is insulated from a second portion of the conductive paste in the second opening.

18. The method of claim 13, wherein the sensor or emitter area comprises a first cavity and a second cavity.

19. A method of manufacturing a semiconductor packages, the method comprising:
    attaching a first main surface of a first semiconductor arrangement to a metal band, the semiconductor arrangement comprising a first active area;
    attaching a first main surface of a second semiconductor arrangement to the metal band, the semiconductor arrangement comprising a second active area;
    contacting a first electrode pad disposed on a second main surface of the first semiconductor arrangement to a first contact pad of a metal band between the first semiconductor arrangement and the second semiconductor arrangement;
    contacting a first electrode pad disposed on a second main surface of the second semiconductor arrangement to the first contact pad;
    encapsulating the first semiconductor arrangement and the second semiconductor arrangement by embedding the first and second semiconductor arrangements in an encapsulant;
    singulating the first and second encapsulated semiconductor arrangements through the first and second active areas; and
    singulating the contact pad of the metal band thereby forming the semiconductor packages, wherein each semiconductor package comprises an exposed first sidewall and a portion of the contact pad.

20. The method of claim 19, wherein the encapsulant comprises a mold compound material.

21. The method of claim 19, wherein the exposed first sidewall comprises an optical edge emitter or an optical edge sensor.

22. The method of claim 19, wherein the exposed first sidewall comprises a pressure sensor.

23. The method of claim 19, wherein contacting a second electrode pad disposed on the second main surface of the first semiconductor arrangement to the first contact pad.

24. The method of claim 23, wherein contacting a second electrode pad disposed on the second main surface of the second semiconductor arrangement to the first contact pad.

25. The method of claim 19, wherein contacting a second electrode pad disposed on the second main surface of the first semiconductor arrangement to a second contact pad.

26. The method of claim 25, wherein contacting a second electrode pad disposed on the second main surface of the second semiconductor arrangement to a third contact pad.

\* \* \* \* \*